United States Patent [19]

Huijsing et al.

[11] Patent Number: 4,678,947
[45] Date of Patent: Jul. 7, 1987

[54] SIMULATED TRANSISTOR/DIODE

[75] Inventors: Johan H. Huijsing, A B Den Hoorn, Netherlands; Timothy A. Dhuyvetter, San Jose, Calif.

[73] Assignee: Signetics Corporation, Sunnyvale, Calif.

[21] Appl. No.: 658,333

[22] Filed: Oct. 5, 1984

[51] Int. Cl.$^4$ .......................... G06G 7/12; H03K 3/01; H03K 3/26
[52] U.S. Cl. ................. 307/490; 307/296 R; 307/317 R; 323/280
[58] Field of Search ............... 307/490, 317 R, 362, 307/363, 296 R, 360; 328/142; 323/280, 281

[56] References Cited

U.S. PATENT DOCUMENTS 3,541,350 11/1970 Luetze .................................. 307/317
4,500,798 2/1985 Pike ...................................... 307/490

FOREIGN PATENT DOCUMENTS 948285 5/1974 Canada ................................ 307/362

OTHER PUBLICATIONS

P. Gray et al, *Analysis and Design of Analog Integrated Circuits* (John Wiley and Sons: 1977), pp. 252-254.
J. Gunn, "New Techniques in Power Control," 1970 *IEEE ISSCC Dig. Tech. Paps.*, 19 Feb. 1970, pp. 90-91.

*Primary Examiner*—Stanley D. Miller
*Assistant Examiner*—B. P. Davis
*Attorney, Agent, or Firm*—R. J. Meetin; R. T. Mayer; J. Oisher

[57] ABSTRACT

A circuit capable of simulating a transistor or a semiconductor diode with controllably adjusted voltage characteristics contains a main transistor (Q0). An input voltage ($V_{CS}$) to a control system (8) is amplified with a gain set by a pair of resistors (R1 and R2) to produce a control voltage ($V_C$) for the transistor. This downscales the forward voltage characteristics of the circuit from those of the transistor. A floating power supply (10) in series with the control electrode of the transistor permits upscaling or further downscaling of the circuit voltage range.

17 Claims, 6 Drawing Figures

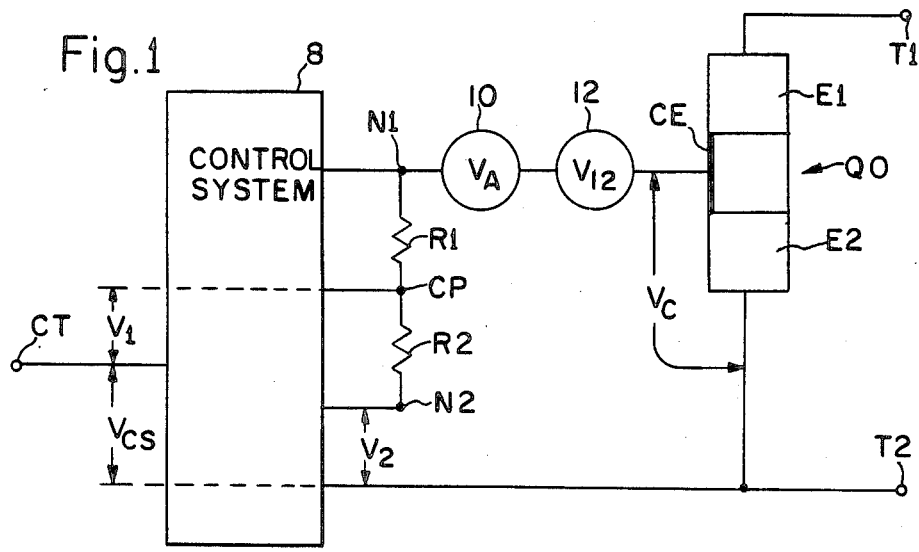
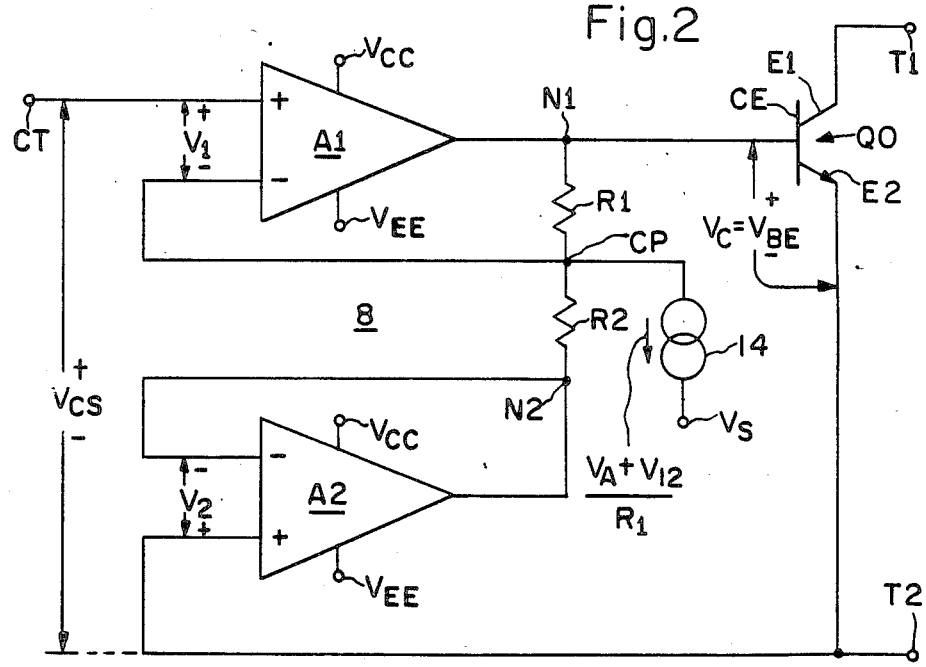

SIMULATED TRANSISTOR/DIODE

FIELD OF USE

This invention relates to circuits that act like transistors or semiconductor diodes with shifted operational characteristics.

BACKGROUND ART

Some electronic applications entail the use of current rectifiers whose optimum voltage properties cannot readily be achieved with an integral number of standard semiconductor rectifying elements. Circuits that simulate PN diodes but have shifted forward voltage characteristics are often employed in these applications.

In discussing such circuits here, the term "$V_{BE}$" refers to the voltage across the base-emitter junction of a bipolar transistor. When preceded by "standard", this term means the base-to-emitter voltage of an NPN transistor when it just becomes forwardly conductive. Accordingly, the forward voltage across a conductive PN diode is about 1 standard $V_{BE}$.

In a typical case, the threshold voltage of a rectifier must exceed a standard $V_{BE}$ but must not equal an exact number of (two or more) standard $V_{BE}$'s. This case is often handled with a $V_{BE}$ multiplier in which the base of an NPN transistor is coupled to its collector through one resistor and to its emitter through another resistor. As described in P. Gray et al, *Analysis and Design of Analog Integrated Circuits* (John Wiley and Sons: 1977), pp. 252-254, the $V_{BE}$ multiplier acts like a semiconductor diode whose forward conductive voltage equals a standard $V_{BE}$ multiplied by one plus the ratio of the resistor values.

The situation becomes more difficult if the optimum threshold voltage is less than a standard $V_{BE}$. One solution to this problem is described in J. Gunn, "New Techniques In Power Control," 1970 IEEE ISSCC Dig. Tech. Paps., Feb. 19, 1970, pp. 90-91. In Gunn, a simulated diode contains a PNP transistor connected to a transformer in such a manner that appropriate selection of the transformer turns ratio enables the threshold voltage of the diode to drop below a standard $V_{BE}$.

Gunn's simulated diode is, however, limited to AC operation. In addition, the transformer is not an element normally made in manufacturing integrated circuits. Modifying the manufacturing process to incorporate the transformer is difficult and costly. Providing the transformer as an element separate from an integrated circuit is unattractive. A circuit capable of acting as a rectifier with a forward voltage of less than a standard $V_{BE}$ for both AC and DC situations yet manufacturable with standard semiconductor elements is quite desirable.

DISCLOSURE OF THE INVENTION

This invention centers on a circuit employable in AC and DC situations to simulate a transistor or semiconductor diode with controllably adjusted voltage characteristics. The circuit is floating in the sense that its operation is not restricted by a reference voltage.

The circuit has a control terminal and a pair of flow terminals, termed the first and second terminals, between which current flows in response to an input voltage between the control and second terminals. The voltage characteristics of the circuit are shifted from those of a main transistor in the circuit. This transistor has a first flow electrode coupled to the first terminal, a second flow electrode coupled to the second terminal, and a control electrode for regulating current transmission between the flow electrodes. One resistor is coupled between a control point and a node coupled to the control electrode. Another resistor is coupled between the control point and another node. A control system regulates the voltage at the control point in response to the input voltage and supplies current to/from the nodes without substantially affecting the currents at the flow terminals.

With the foregoing arrangement, the control point voltage is amplified by a gain set by the resistors to produce a control voltage for the main transistor. This downscales the forward voltage characteristics of the circuit. It can then become forwardly conductive at a voltage of lower magnitude than the transistor.

The present circuit preferably has a portion that acts like a "floating battery" coupled between the first-mentioned node and the control electrode. This circuit portion alters the transistor control voltage by causing the voltage between the control point and the control electrode to differ by a selected amount from that otherwise caused by the control system. The sign of this selected voltage is normally chosen so as to further downscale the forward voltage characteristics. The opposite sign may, however, be chosen. The voltage characteristics are then downscaled or upscaled depending on the magnitudes of the selected voltage and the gain.

There are at least two ways of utilizing the circuit in a "rectifying" mode. Firstly, the circuit may be configured as a rectifying buffer by using a bipolar device for the main transistor. Its collector and emitter are the first and second electrodes through which (positive) current moves in a single flow direction during normal bipolar operation. Current at the control terminal also moves in a single flow direction when the input voltage is at a value sufficient to turn on the transistor. This configuration exhibits high input impedance and low output impedance. Secondly, the circuit can simulate a diode by coupling the first terminal to the control terminal. Combining these two possibilities and suitably choosing the selected voltage enables the circuit to act like a diode having a forward voltage less than a standard $V_{BE}$.

The present circuit is highly accurate. It is manufacturable with normal semiconductor elements. In addition to the resistors and main transistor which are standard elements, the control system is preferably embodied with one or more amplifiers that utilize conventional semiconductor elements. The same is true with the floating battery circuit portion which may be a separate semiconductor component or may be incorporated in the control system.

BRIEF DESCRIPTION OF THE DRAWINGS

FIG. 1 is a block diagram of a circuit simulating a transistor in accordance with the invention.

FIG. 2 is a block and circuit diagram of a more particular embodiment of the circuit of FIG. 1.

Like reference symbols are employed to identify the same or very similar item or items in the drawings and in the description of the preferred embodiments.

DESCRIPTION OF THE PREFERRED EMBODIMENTS

Figure 3:
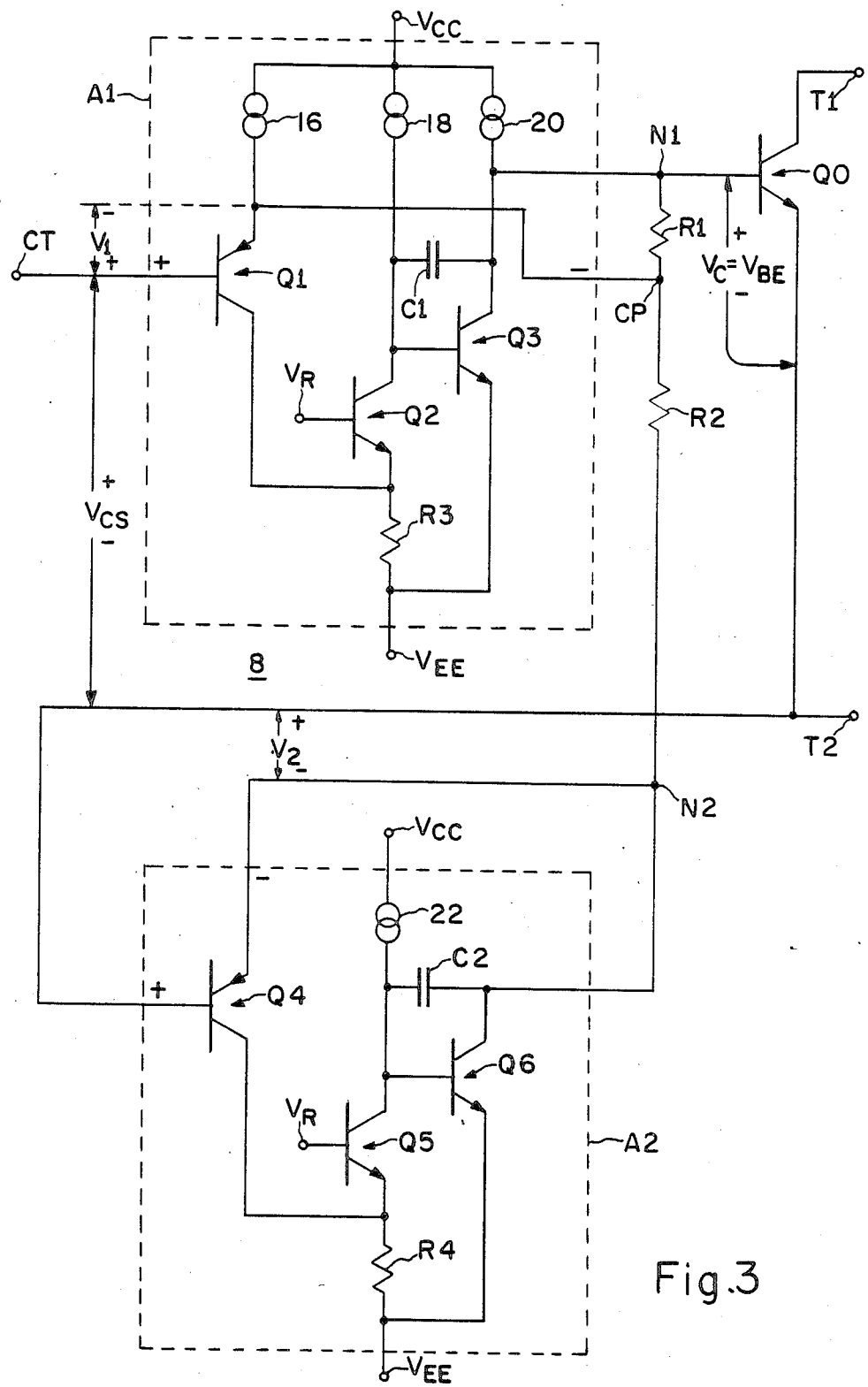
FIG. 3 is a circuit diagram of a bipolar embodiment of FIG. 2.

A general transistor has a control electrode and a pair of flow electrodes through which current transmission is regulated by a control voltage, denoted here as $V_C$, between the control electrode and one of the flow electrodes. The variation of control voltage $V_C$ with current through the transistor depends on how it is fabricated and on the basic semiconductor properties of the transistor. The $V_C$ variation with current is particularly limited if the transistor is a bipolar device. For low-voltage applications, $V_C$ must often be small (in absolute value).

Limitations on $V_C$ can be overcome with a circuit responsive to a simulated control voltage, denoted here as $V_{CS}$, so as to control $V_C$ according to $$V_{CS} = (V_C - V_A)/B \tag{1}$$

where $V_A$ is a selected voltage that is approximately constant, and B is a constant greater than unity. Such a circuit acts like a conventional transistor except that the voltage characteristics are shifted according to Eq. (1).

$V_{CS}$, $V_C$, and $V_A$ are preferably all positive or all negative. $V_{CS}$ is therefore less than $V_C$ in absolute value. This is also true if $V_A$ is zero. That is, the voltage characteristics of the circuit are downscaled from those of the transistor responsive to voltage $V_C$. For a given $V_C$ magnitude, the transistor reaches the same operational condition at a lower $V_{CS}$ magnitude.

$V_A$ may, however, be of opposite sign to $V_C$. The magnitudes of $V_A$ and B then determine whether $V_{CS}$ is larger or smaller than $V_C$ in absolute value at a given transistor current. That is, the voltage range of the circuit may be upscaled or downscaled. For certain magnitudes of $V_A$ and B, there is even a cross-over transistor current at which the voltage characteristics switch from being upscaled to downscaled.

FIG. 1 illustrates a three-terminal circuit that implements the adjusted voltage range of Eq. (1). This simulated transistor circuit has a high-impedance control terminal CT that receives an input voltage signal for controlling current flow between a pair of flow terminals T1 and T2. The input voltage is voltage $V_{CS}$ taken between terminals CT and T2.

The circuit centers on a main transistor QO which has a control electrode CE that regulates the current between a first flow (or current-sink) electrode E1 and a second flow (or current-source) electrode E2 respectively connected to terminals T1 and T2. The voltage between electrodes CE and E2 is transistor control voltage $V_C$. Transistor QO may be a bipolar device or a field-effect transistor (FET) of either the insulated-gate or junction type. In the bipolar case, electrodes CE, E1, and E2 are respectively the base, collector, and emitter; $V_C$ is $V_{BE}$. In the FET case, electrodes CE, E1, and E2 respectively are the gate, drain, and source; $V_C$ is the gate-to-source voltage.

The factor B in Eq. (1) is provided by a pair of resistors R1 and R2 interconnected at a control point CP between respective nodes N1 and N2. The combination of resistors R1 and R2 amplifies the voltage at control point CP to produce an amplified voltage at node N1. The amplification factor is constant B given as $$B = 1 + R_1/R_2 \tag{2}$$

where R1 and R2 are the respective values of resistors R1 and R2.

A control system 8 regulates the voltage at point CP in response to input voltage $V_{CS}$ in such a manner that the CP voltage largely follows voltage $V_{CS}$. The voltage $V_1$ between terminal CT and point CP is the near a specified (constant) value. Control system 8 supplies current at nodes N1 and N2 for resistors R1 and R2 and for the QO base which is coupled to node N1. For example, control 8 provides (positive) current at node N1 and withdraws (positive) current at node N2. This is done without substantially affecting the currents at terminals T1 and T2. The voltage $V_2$ between terminal T2 and node N2 is likewise near a specified (constant) value.

The $V_A$ factor in Eq. (1) is provided by a portion of the circuit illustrated as a floating power supply (or battery) 10 in series with electrode CE. This circuit portion imposes voltage $V_A$ on the voltage that control system 8 otherwise causes to exist between point CP and electrode CE.

In addition, another floating power supply 12 in series with battery 10 between node N1 and electrode CE provides a corrective voltage factor $V_{12}$ that accounts for voltages $V_1$ and $V_2$. The $V_{12}$ correction is preferably set at $V_{20} + B(V_{10} - V_{20})$ where $V_{10}$ and $V_{20}$ are the respective constant components of $V_1$ and $V_2$. Although represented by separate batteries 10 and 12 in FIG. 1, the circuit portions that supply voltages $V_A$ and $V_{12}$ are typically a single circuit component implemented by other techniques.

The circuit operates generally as follows. Control system 8 causes the CP voltage to increase when voltage $V_{CS}$ increases and vice versa without "drawing" significant current from transistor QO. The CP voltage is amplified by factor B (set by resistors R1 and R2) and combined with voltage $V_A$ to produce voltage $V_C$ which controls transistor QO. The circuit then simulates a transistor responsive to voltage $V_{CS}$.

Inasmuch as the CT input terminal is a high-impedance input, the circuit functions as a rectifier by simply interconnecting terminals CT and T1. Current then flows unidirectionally between terminal T2 and the joint T1/CT terminal. This occurs when the forward voltage $V_{CS}$ of the simulated diode reaches a threshold value determined by Eq. (1) from the QO conductive threshold.

In general, transistor QO becomes conductive only when current moves in a single flow direction at terminal CT. If transistor QO is a bipolar device whose emitter and collector are normally fixed (in contrast to an FET whose source and drain are often interchangeable), the circuit acts like a rectifying buffer with respect to the currents flowing at terminals CT and T2. Tying terminals CT and T1 together and suitably selecting the value of voltage $V_A$ (e.g., choosing $V_A$ to be zero or of the same sign but lower magnitude than $V_C$) enables the circuit to simulate a PN diode whose forward voltage is less than a standard $V_{BE}$.

FIG. 2 illustrates a more particular embodiment of the circuit. In FIG. 2, transistor QO is an NPN transistor which turns on when its $V_{BE}$ reaches a standard $V_{BE}$ of 0.6–0.8 volt. Control system 8 consists of two-input high-gain amplifiers A1 and A2 that respectively function as a current source and a current sink for current through resistors R1 and R2. Amplifiers A1 and A2 are each connected between low and high voltage supplies $V_{EE}$ and $V_{CC}$. Batteries 10 and 12 are implemented with a current supply 14 connected between point CP and a voltage supply $V_S$. The $V_S$ supply voltage is more negative than the CP voltage (e.g., $V_S$ is $V_{EE}$) if (positive) current is to flow out of point CP to supply 14, and vice versa.

In control system 8, amplifier A1 has non-inverting and inverting input terminals respectively connected to terminal CT and point CP. Voltage $V_1$ thus occurs between the A1 input terminals. The A1 output terminal is connected to node N1 to provide current for elements R1, R2, and QO.

The A2 output terminal is connected to node N2 to receive current from resistors R1 and R2. The output of amplifier A2 is also connected to its inverting input terminal, enabling amplifier A2 to be a voltage follower. Amplifier A2 has its non-inverting input terminal connected to terminal T2 so that voltage $V_2$ exits between its input terminals.

Amplifiers A1 and A2 may be true operational amplifiers having high input impedances. The amplifier input currents are then very small compared to the R1 and R2 currents. Each voltage $V_1$ or $V_2$ consists of the associated amplifier input signal and an amplifier offset voltage (that results from non-ideal components). The constant components $V_{10}$ and $V_{20}$ are the corresponding A1 and A2 offset voltages which are ideally zero. The signal components of $V_1$ and $V_2$ are quite small. As a result, the voltages at point CP and terminal T2 are always very close to the respective voltages at terminal CT and node N2.

Alternatively, amplifiers A1 and A2 may have (intentionally non-zero) input bias voltages. Each voltage $V_1$ or $V_2$ then consists of its input signal component, its voltage offset component, and its bias component. For voltage $V_1$ or $V_2$, its constant portion $V_{10}$ or $V_{20}$ equals the sum of its offset and bias components. During operation, the CP voltage thereby differs intentionally from voltage $V_{CS}$ but closely follows it. Similarly the T2 voltage differs from the N2 voltage by largely a constant amount.

Turning to supply 14, it provides a current of $(V_A+V_{12})/R_1$. This current flows through resistor R1 across which a voltage drop of $V_A+V_{12}$ thereby occurs. This is in addition to the voltage drop due to the current sunk by amplifier A2. A voltage drop of $V_A+V_{12}$ also must occur along the path extending past node N1 through amplifier A1. This voltage is produced internally in amplifier A1 and is therefore not explicitly shown in FIG. 2.

The absolute value of $V_{BE}$ is approximately $(kT/q)\ln(I_C/I_S)$, where k is Boltzmann's constant, T is the temperature, q is the electronic charge, $I_C$ is the collector current, and $I_S$ is the saturation current. $V_A$ can be expressed as $(kT/q)\ln A$, where A is constant at given temperature T. Substituting these two relationships into Eq. (1) leads to $$V_{CS}=(kT/qB)\ln(I_C/AI_S) \quad (3)$$

Eq. (3) precisely shows how use of constants B and $V_A$ (or A) leads to a simulated bipolar transistor with adjusted voltage characteristics.

FIG. 3 depicts a bipolar embodiment of FIG. 2 in which amplifiers A1 and A2 have input bias voltages. The A1 non-inverting and inverting inputs in FIG. 3 are respectively connected to the base and emitter of a PNP transistor Q1. Consequently, the input bias component of voltage $V_1$ is about $-1$ standard $V_{BE}$ when transistor Q1 is fully conductive. The Q1 collector is connected to the emitter of an NPN transistor Q2 and also to one end of a resistor R3 whose other end is tied to the $V_{EE}$ supply. A reference voltage $V_R$ is supplied to the base of transistor Q2. Its collector drives an NPN transistor Q3 whose emitter is tied to the $V_{EE}$ supply. The Q3 collector provides the A1 output signal to node N1. A capacitor C1 is connected between the Q3 collector and base to provide frequency compensation for amplifier A1. Current supplies 16, 18, and 20 are connected between the $V_{CC}$ supply on one hand and the Q1 emitter, the Q2 collector, and the Q3 collector, respectively, on the other hand.

In a similar manner, the A2 non-inverting and inverting inputs are respectively connected to the base and emitter of a PNP transistor Q4. The $V_2$ input bias component is likewise about $-1$ standard $V_{BE}$ when transistor Q4 is fully on. NPN transistors Q5 and Q6, a resistor R4, and a compensating capacitor C2 in amplifier A2 are connected to each other and to transistor Q4 in the same way that elements Q2, Q3, R3, and C1 are respectively connected to each other and to transistor Q1. The Q6 collector provides the A2 output signal to node N2. A current supply 22 is connected between the $V_{CC}$ supply and the Q5 collector. Supply currents for transistors Q4 and Q6 are provided from resistor R2 by way of node N2.

With respect to current supply 14/batteries 10 and 12 in FIG. 3, "$V_A+V_{12}$" is typically negative. This occurs because $V_A$ is normally less than 1 standard $V_{BE}$ while $V_{20}$ is about $-1$ standard $V_{BE}$. Supply 14 is then implemented in FIG. 3 by simply choosing the value of current supply 16 to be $|(V_A+V_{12})/R_1|$ more than that otherwise needed to provide the Q1 quiescent current. The "excess" current from supply 16 flows through resistor R1 in the reverse direction to that which would cause a positive voltage drop from node N1 to point CP. Accordingly, negative voltage "$V_A+V_{12}$" occurs across resistor R1.

With the foregoing in mind, the circuit of FIG. 3 operates as follows. Assume that voltage $V_{CS}$ is initially zero. The CP voltage is about 1 standard $V_{BE}$ above $V_{CS}$. Transistor Q1 is highly conductive and provides its quiescent current to resistor R3. This raises the emitter voltage of transistor Q2 and causes it to be lowly conductive. The Q2 collector voltage is high, enabling transistor Q3 to be on. Transistor Q3 sinks the current from supply 20 plus the R1 current from supply 16. Transistor QO is off since the Q3 collector voltage is low. The QO $V_{BE}$ is zero at this point. Little current flows through resistor R2. Accordingly, transistors Q4–Q6 are generally in the opposite respective conductive conditions to transistors Q1–Q3.

As $V_{CS}$ rises above zero, $V_1$ increases slightly due to the A1 amplifying characteristic. However, the A1 amplification is sufficiently great that the $V_1$ change is not significant. The CP voltage therefore follows $V_{CS}$ upward. Transistor Q1 becomes less conductive, causing transistor Q2 to turn on harder so that transistor Q3 becomes less conductive. This diverts current from supply 20 to resistors R1 and R2 and the QO base. Due to the amplification set by resistors R1 and R2, $V_C$ rises more than $V_{CS}$ by factor B. Transistors Q4–Q6 generally undergo opposite changes to those respectively occuring in transistors Q1–Q3. Transistor Q6 now sinks appreciable current from resistor R2. Transistor Q0 turns on when its $V_{BE}$ reaches 1 standard $V_{BE}$. The reverse occurs when $V_{CS}$ is later decreased.

A significant feature of the circuit of FIG. 3 is that the Q0 emitter can reach low supply voltage $V_{EE}$. This provides great flexibility in using the circuit. The power supply range ($V_{CC}-V_{EE}$) may be as low as 1 volt.

In a preferred embodiment, resistors R1 and R2 are 5 and 10 kiloohms, respectively. B is thus 1.5. Resistor R3 or R4 is 11.3 kiloohms. Capacitor C1 or C2 is 4 picofarads. Supplies 16, 18, 20, and 22 are 46, 4, 34, and 4 microamperes, respectively. The Q1 or Q4 quiescent current is 4 microamperes. Factor $V_A$ is 0.4 volt. Correction $V_{12}$ is about $-0.6$ volt. Voltage $V_R$ is about 0.7 volt. Supplies $V_{EE}$ and $V_{CC}$ are 0 volt and 1 volt or more, respectively. Amplifiers A1 and A2 have amplifications of about $10^4$.

Figure 4:
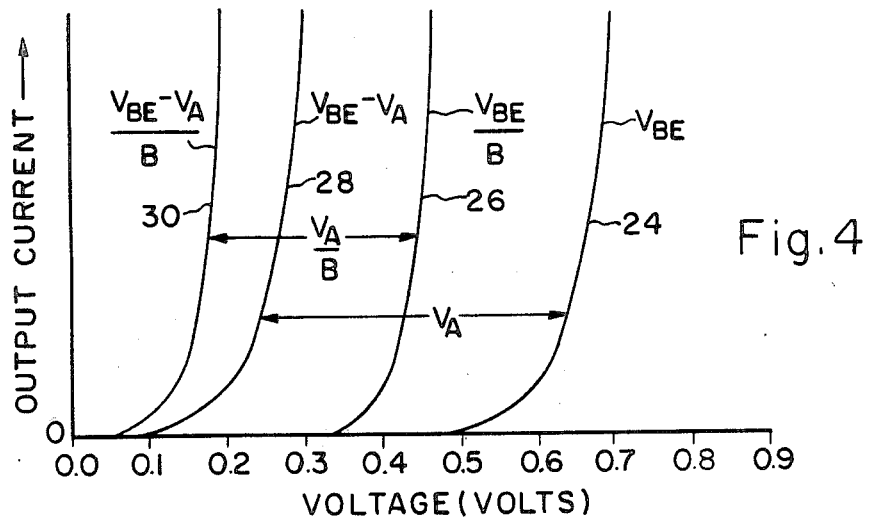
FIG. 4 is a graph illustrating output current as a function of voltage.

Turning to FIG. 4, it shows curves indicating the performance of the foregoing embodiment. Each curve depicts the output current flowing between terminals T1 and T2 as a function of voltage. Curve 24 indicates the basic $V_{BE}$ characteristic of transistor Q0. Curve 26 shows how $V_{CS}$ would appear if $V_A$ were zero. Curve 28 represents how $V_{CS}$ would appear if B were unity. Finally, curve 30 shows how $V_{CS}$ varies when $V_A$ and B have the values given above.

Figure 5:
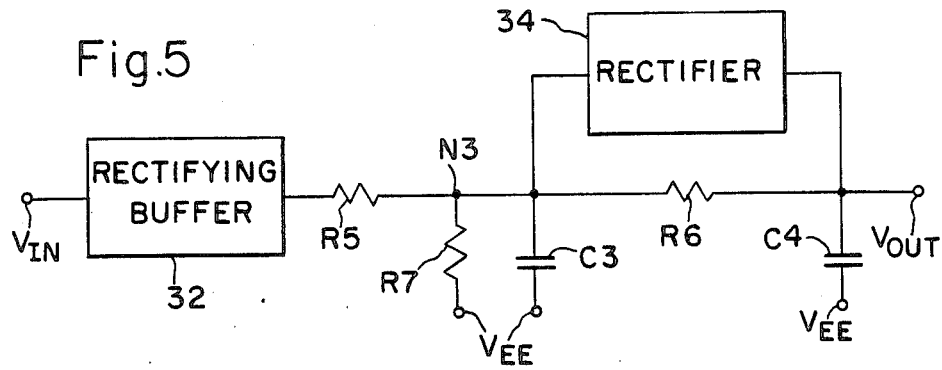
FIG. 5 is a block and circuit diagram of an envelope detector employing the circuit of FIG. 3.

The circuits of FIGS. 1-3 are especially useful in an envelope detector arranged as shown in FIG. 5. This detector provides an output signal $V_{OUT}$ in the shape of the envelope of a high-frequency audio input signal $V_{IN}$. One important component of the envelope detector is a rectifying buffer 32 coupled between the $V_{IN}$ terminal and a node N3. Buffer 32 is configured as described above for FIG. 3 with terminal T1 tied to the $V_{CC}$ supply. Another important component is a rectifier 34 coupled between node N3 and the $V_{OUT}$ terminal. Rectifier 34 is configured as described above for FIG. 3 with terminals CT and T1 tied together. Resistors R5 and R6 basically set the respective charging times for capacitors C3 and C4 which discharge through resistor R7 to the $V_{EE}$ supply.

Figure 6:
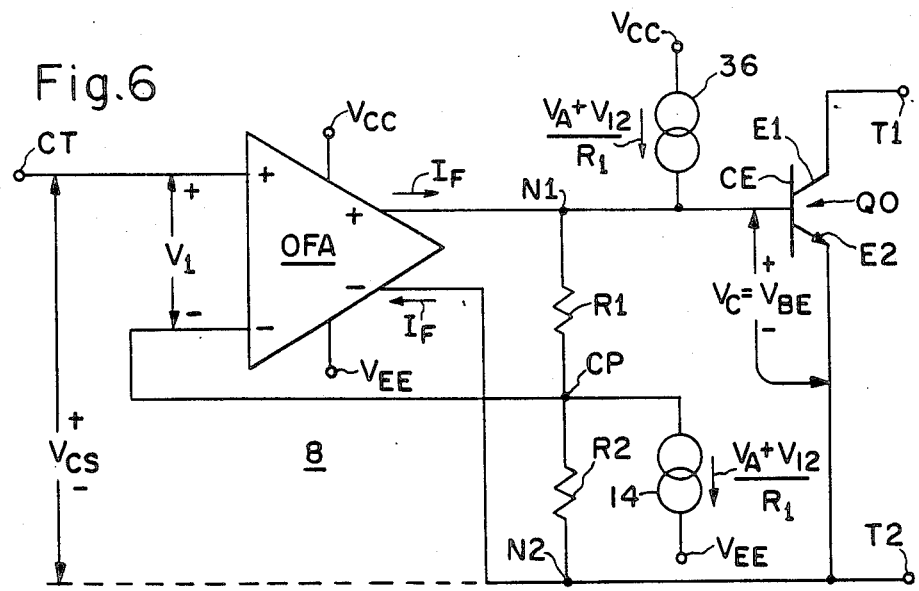
FIG. 6 is a block and circuit diagram of another particular embodiment of FIG. 1.

FIG. 6 illustrates another particular embodiment of FIG. 1 in which control system 8 is implemented with an operational floating amplifier OFA connected between the $V_{EE}$ and $V_{CC}$ supplies. Voltage $V_1$ exists between the OFA non-inverting and inverting input terminals respectively connected to terminal CT and point CP. The OFA non-inverting and inverting output terminals are respectively connected to nodes N1 and N2 so that voltage $V_2$ is zero. The current $I_F$ at the non-inverting OFA output is approximately equal in magnitude but opposite in direction to the current at the inverting OFA output.

The implementation of control 8 with amplifier OFA is generally simpler than with amplifiers A1 and A2 of FIGS. 2 and 3. A disadvantage, however, is that the circuitry used to embody amplifier OFA normally prevents the emitter of NPN transistor Q0 from reaching $V_{EE}$. Batteries 10 and 12 are implemented with current supply 14 and an equal-value current supply 36 connected to node N1. Supplies 14 and 36 may be respectively connected to the $V_{EE}$ and $V_{CC}$ supplies (as shown) or vice versa depending on whether "$V_A+V_{12}$" is positive or negative.

Methods for manufacturing the various elements of the present circuits are well known in the semiconductor art. Each circuit is preferably fabricated as part of a monolithic integrated circuit using PN-junction isolation to separate active regions in a semiconductor wafer.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results. Thus, various modifications, changes and applications may be made by those skilled in the art without departing from the true scope and spirit of the invention as defined by the appended claims.

What is claimed is:

1. A circuit in which current flow between first and second flow terminals thereof is controlled in response to an input voltage between a control terminal thereof and the second terminal, the circuit comprising:
    a main transistor having a first flow electrode coupled to the first terminal, a second flow electrode coupled to the second terminal, and a control electrode for regulating currect transmission between the flow electrodes;
    a first resistor coupled between a control point and a first node which is coupled to the control electrode;
    a second resistor coupled between the control point and a second node; and
    control means for regulating the voltage at the control point in response to the input voltage and for supplying current to/from the nodes without substantially affecting the currents at the flow terminals, the control means coupled to the nodes, the control point, and the control terminal which are all separate from one another, $V_{CS}$ being approximately $V_C/B$ where $V_{CS}$ is the input voltage, $V_C$ is the voltage between the control and second electrodes and B equals one plus the ratio of the value of the first resistor to the value of the second resistor.

2. A circuit in which current flow between first and second flow terminals thereof is controlled in response to an input voltage between a control terminal thereof and the second terminal, the circuit comprising:
    a main transistor having a first flow electrode coupled to the first terminal, a second flow electrode coupled to the second terminal, and a control electrode for regulating current transmission between the flow electrodes;
    a first resistor coupled between a control point and a first node which is coupled to the control electrode;
    a second resistor coupled between the control point and a second node;
    control means for regulating the voltage at the control point in response to the input voltage and for supplying current to/from the nodes without substantially affecting the currents at the flow terminals, the control means coupled to the nodes, the control point, and the control terminal which are all separate from one another; and
    means for causing the voltage between the control electrode and the control point to differ by at least a selected voltage from that otherwise due to regulation of the voltage at the control point in response to the input voltage, $V_{CS}$ being approximately $(V_C-V_A)/B$ where $V_{CS}$ is the input voltage, $V_C$ is the voltage between the control and second electrodes, $V_A$ is the selected voltage, and B equals one plus the ratio of the value of the first resistor to the value of the second resistor.

3. A circuit as in claim 2 wherein $V_{CS}$, $V_C$, and $V_A$ are either all positive or all negative.

4. A circuit as in claim 1, 2, or 3 wherein the voltage at the control point largely follows the input voltage.

5. A circuit as in claim 1 or 2 wherein the control terminal is coupled to the first terminal.

6. A circuit as in claim 1 or 2 wherein the control means forces the voltage between the control point and the control terminal to be near a specified value and forces the voltage between the second node and the second terminal to be near a specified value.

7. A circuit as in claim 6 wherein the control means comprises:
first amplifying means having an inverting input terminal coupled to the control point, a non-inverting input terminal coupled to the control terminal, and a output terminal coupled to the first node; and
second amplifying means having an inverting input terminal coupled to the second node, a non-inverting input terminal coupled to the second terminal, and an output terminal coupled to the second node.

8. A circuit as in claim 7 wherein the transistor is a bipolar transistor having a base, a collector, and an emitter which respectively are the control, first, and second electrodes.

9. A circuit as in claim 6 including means for imposing a corrective voltage between the control electrode and the control point to account for the voltage between the control point and the control terminal and for the voltage between the second node and the second terminal.

10. A circuit as in claim 1 or 2 wherein the control means comprises operational floating amplifying means having non-inverting and inverting input terminals respectively coupled to the control terminal and the control point and having non-inverting and inverting output terminals respectively coupled to the first and second nodes.

11. A circuit as in claim 1 or 2 wherein the first node is directly connected to the control electrode.

12. An envelope detector having first means coupled between an input terminal and an intermediate node for providing it with current moving in only single flow direction, second means coupled between the node and an output terminal for providng it with current moving in only a single flow direction, an impedance between the first means and the node, an impedance between the node and a voltage supply, an impedance between the node and the output terminal, a capacitor between the node and the voltage supply, and a capacitor between the output terminal and the voltage supply, characterized in that each of the means is a circuit in which current flow between first and second flow terminals thereof is controlled in response to an input voltage between a control terminal thereof and the second terminal, the circuit comprising:
a main transistor having a first flow electrode coupled to the first terminal, a second flow electrode coupled to the second terminal, and a control electrode for regulating current transmission between the flow electrodes;
a first resistor coupled between a control point and a first node which is coupled to the control eectrode;
a second resistor coupled between the control point and a second node; and
a control system for regulating the voltage at the control point in response to the input voltage and for supplying current to/from the nodes without substantially affecting the currents at the flow terminals, the control system coupled to the nodes, the control point, and the control terminal which are all separate from one another.

13. A circuit as in claim 12 characterized in that at least one of the means includes a circuit portion for causing the voltage between the control electrode of that means and its control point to differ by at least a selected voltage from that otherwise due to regulation of the voltage at its control point in response to its input voltage.

14. A circuit as in claim 12 or 13 characterized in that: the first means has its control and second terminals respectively coupled to the input terminal and the node; and the second means has its control and second terminals respectively coupled to the node and the output terminal.

15. A detector as in claim 14 characterized in that the first means has its first terminal coupled to a voltage supply.

16. A detector as in claim 14 chracterized in that the second means has its first terminal coupled to its control terminal.

17. A detector as in claim 12 or 13 wherein each impedance comprises a resistor.

* * * * *